June 4, 1968 VEN Y. DOO 3,386,865

PROCESS OF MAKING PLANAR SEMICONDUCTOR DEVICES ISOLATED BY ENCAPSULATING OXIDE FILLED CHANNELS

Filed May 10, 1965

INVENTOR.
VEN Y. DOO

BY Alvin J. Riddles

ATTORNEY 3,386,865
Patented June 4, 1968

3,386,865

PROCESS OF MAKING PLANAR SEMICONDUCTOR DEVICES ISOLATED BY ENCAPSULATING OXIDE FILLED CHANNELS

Ven Y. Doo, Poughkeepsie, N.Y., assignor to International Business Machines Corporation, Armonk, N.Y., a corporation of New York Filed May 10, 1965, Ser. No. 454,374
4 Claims. (Cl. 148—175)

This invention relates to semiconductor devices and in particular to planar type isolated semiconductor devices.

In the planar type of fabrication, a plurality of individual semiconductor elements are formed in a substrate of semiconductor material by steps which are all conducted through a single major surface. Such fabrication of planar type devices on a single substrate has as a goal the fabrication of the maximum number of devices on the major surface, while at the same time electrically isolating each device and its contacts and accomplishing this with a minimum of critical spacing restrictions on the electrodes which provide circuit connections to the individual devices. The technique involves the use of an encapsulating material which serves to protect the PN junctions of the finished product and to serve as a shape delineating member in the formation of portions of the devices. Previous approaches in the art to provide isolation between individual devices require added difficult processing, critical inter-device spacing, or unreliability in providing high resistance paths between devices.

The preferable isolating medium should provide a minimum of deleterious electrical effects to the device and yet provide good heat transfer.

The encapsulating material has good electrical properties and it would be desirable to use the encapsulating material in a channel for isolation but encapsulating material has been found to provide an undesirable low resistance current path where it contacts the substrate.

What has been discovered is a combination of structural features and processing steps in the fabrication of a planar device which provide a semiconductor device that is isolated by a channel of an encapsulating material and a region of higher conductivity type in the substrate where the encapsulating material contacts the surface of the substrate.

It is an object of this invention to provide an improved process of fabricating an isolated planar semiconductor device with low parasitic capacitance and high heat conductivity.

It is another object of this invention to prevent the formation of an inversion layer in an encapsulating oxide filled isolating channel in a planar semiconductor device.

It is another object of this invention to provide a method of permitting an encapsulating oxide to isolate a planar semiconductor device.

It is another object of this invention to provide an improved planar device isolating structure comprising a channel of an encapsulating oxide contiguous with a surface of higher conductivity type material.

It is another object of this invention to inhibit the formation of an inversion layer at a $SiO_2$ definite conductivity type silicon interface.

It is another object of this invention to provide an isolating structural principle in the fabrication of planar devices.

The foregoing and other objects, features and advantages of the invention will be apparent from the following more particular description of the preferred embodiment of the invention, as illustrated in the accompanying drawings.

When an integrated semiconductor device is formed in a substrate of high resistivity semiconductor material, the provision of isolation channels of an encapsulating material (silicon dioxide, for example) surrounding the device results in a conversion of the semiconductor material to opposite conductivity type where the encapsulating material is placed in contact with the semiconductor substrate and this operates to provide a low resistance path between semiconductor devices. The nature of the conductivity type conversion is not completely understood but the effect thereof can be controlled in accordance with the invention by the inclusion of a region having a higher concentration of conductivity type determining impurities in the surface region of the substrate where the isolating channel is desired.

Figure 1:
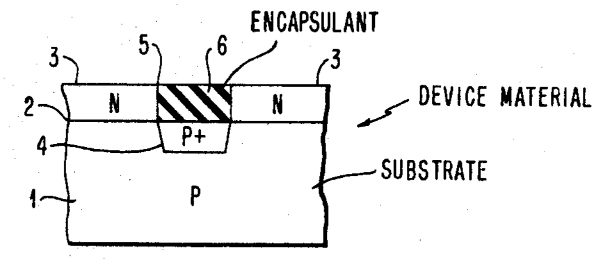
FIG. 1 is an illustration of the planar device isolating structural principle of the invention.

Referring to FIG. 1, an illustration is provided of a planar device isolating structural principle in accordance with the invention. The structure of FIG. 1 is a portion of a substrate 1 of semiconductor material of a first conductivity type labelled arbitrarily P and on a major surface 2 thereof a region of opposite conductivity semiconductor material 3 is provided which serves as portions of semiconductor devices. A region of higher conductivity type 4 labelled P+ is provided in the substrate 1 where an isolation channel 5 of encapsulating material 6 comes into contact with the major surface 2 of the substrate 1. The semiconductor material employed most frequently at the present state of development of the art is silicon and the encapsulating material is silicon dioxide. Where the silicon dioxide 6 contacts the surface 2 of the substrate 1 the higher conductivity portion 4 operates to prevent any change in predominance in conductivity type impurities in the substrate 1 which if such change in predominance should take place would result in a region of the same conductivity type as the portions 3 and would serve as a low resistance path therebetween. While the preferred embodiment of the invention involves the use of the materials silicon and silicon dioxide, it will be apparent that any substrate and encapsulant combination may be employed and where the encapsulant by its presence disturbs the concentration or distribution of conductivity type determining impurities in the substrate, the high conductivity type portion 4 will permit isolation to be achieved.

The structural principle of FIG. 1 may be included in a method which operates to provide a buried region of high conductivity material at the bottom of all device isolating channels and this buried region formed in connection with the overall process operates to insure complete yield of all devices, and at the same time complete reliability in the finished product.

Figure 2:
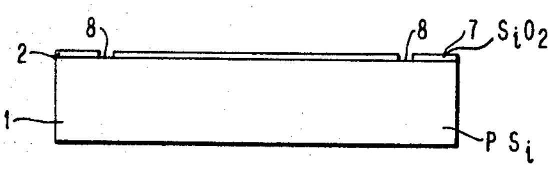
FIGS. 2–6 illustrate a series of steps in the fabrication of the isolated planar semiconductor device of the invention.

Referring next to FIG. 2, in FIG. 2 a P-type silicon substrate 1 is provided with an encapsulant 7 on a major surface 2 to be employed in future processing steps. It will be essential that the encapsulant be sufficiently heat resistant so that diffusion steps can be conducted therethrough. In the case of the semiconductor material silicon, the substrate is monocrystalline and is arbitrarily labelled to indicate P conductivity type. The substrate is provided with an encapsulant 7 by exposure to an oxidizing atmosphere forming a coating 7 of $SiO_2$ thereon. The encapsulant 7 is then opened at points 8 for a further diffusion step. It will be apparent to one skilled in the art that depending on the physical shape of the semiconductor device to be fabricated, there may be one or a plurality of openings 8 or should FIG. 2 be looked upon as a cross section, the two openings 8 may be part of a circular configuration.

Figure 3:
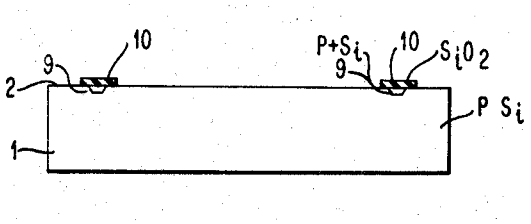

Referring next to FIG. 3, a suitable P conductivity type impurity for the material of substrate 1 is diffused into the openings 8. Since the conductivity of semiconductor material is determined by the predominance of one conductivity type determining impurity over another, and the degree of conductivity or its reciprocal the resistivity is determined by the net quantity of one conductivity type determining impurity over the other, it will be apparent then that the diffusion of the same conductivity type determining impurity into a region characterized by an existing predominance of one conductivity type determining impurity over the other will result in the increase in the conductivity type of the region wherein the diffusion takes place. Accordingly, the diffusion of the same conductivity type determining impurity through openings 8 will result in the formation of a higher conductivity type region 9 labelled P+. The encapsulant layer 7 of $SiO_2$ in the preferred embodiment is then removed by an etching or abrading operation and through a suitable masking operation a new layer of encapsulant covering only the region 9 is provided. The new layer is labelled 10. As previously discussed in the preferred embodiment of silicon and silicon dioxide, the encapsulant or $SiO_2$ is formed by merely heating in water vapor or oxygen or both.

Figure 4:
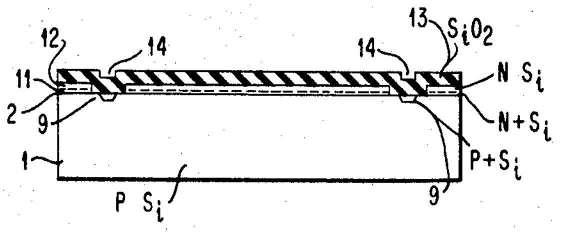

Referring next to FIG. 4, the substrate containing the P+ regions 9 is now subjected to an epitaxial vapor growth operation in the presence of opposite conductivity type impurities in a concentration sufficient to provide a region of high conductivity type semiconductor material on the surface of the substrate. The technique of epitaxial vapor growth is well known in the art and the ability to change the concentration of the conductivity type determining impurities in the vapor and hence to establish both the concentration and distribution of the desired conductivity type determining impurities in the grown material is well established. In order to provide background on this subject, attention is directed to the IBM Journal of Research and Development, July 1960, and the RCA Review, December 1963. Since the highest conductivity is desired adjacent to the surface 2 and a lesser conductivity is desired as the thickness of the epitaxial layer continues, it will be apparent in order to provide the higher conductivity (N+) region 11 first and then the lesser conductivity (N) type region 12 second, that it will be necessary to change the concentration in the vapor of the conductivity (N) type determining impurity. An alternative method to provide the N+ layer on substrate is by diffusing N-type impurities into the exposed silicon whereas the oxide masked region will not be affected. Then a layer of N-type silicon of high resistivity required for devices to be fabricated into it is epitaxially deposited on top of the diffused N+ silicon. The regions 11 and 12 do not grow where the coating 10 is present so that isolating channels in the device material 11 and 12 are formed.

Subsequent to the growth of the regions 11 and 12 a coating of encapsulating $SiO_2$ is applied. This coating is labelled 13 and covers the vapor grown N conductivity type regions 11 and 12 and becomes contiguous with the encapsulant 10 previously applied. It will be noted that since the device material 11 and 12 was grown with isolating channels the formation of the $SiO_2$ region results in depressions 14 in the surface which now permit ease in removal.

Figure 5:
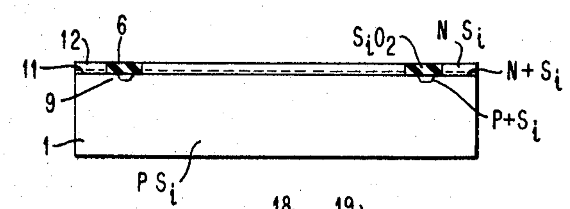

Referring next to FIG. 5, a removal step such as an abrading or differential etching operation is employed which effectively removes the $SiO_2$ layer 13 to permit the exposure of the N device material containing isolating channels of the encapsulating $SiO_2$ 6 under which are regions P+ semiconductor material 9. Thus, devices made in any of the exposed portions of the N region 12 by alloying or diffusing steps well known in the art will be separated by an encapsulating $SiO_2$ isolation channel, and the effect of the encapsulant in providing an opposite conductivity type channel will be prevented by the presence of the P+ region 9.

Figure 6:
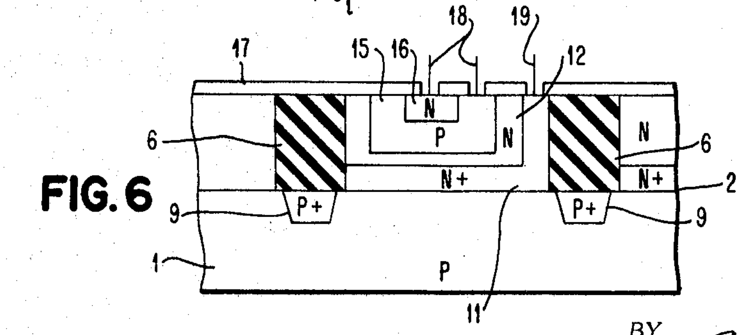

A complete semiconductor device is illustrated in FIG. 6 wherein the scale has been changed to permit illustration. In the device of FIG. 6, in accordance with the invention a portion 9 of higher conductivity P+ material covered by an encapsulant filled channel 6 of $SiO_2$ is employed to isolate the individual semiconductor device. The device itself is formed in the device material layers 11 and 12 on the surface 2 of the substrate 6 by a first diffusion of P conductivity type material through an $SiO_2$ mask forming a region 15 which serves as the base region forming a PN junction with the collector region 12, which in turn, has a high conductivity portion 11 for low device series resistance. A second diffusion or alloying of N conductivity type material again through an $SiO_2$ mask provides an emitter region 16 forming a PN junction with the base region 15. Each of the regions are then protected by a $SiO_2$ coating 17 which covers the exposed PN junctions at the surface and becomes integral with the channel material 6. Suitable electrical contacts 18 are provided through the openings in the $SiO_2$ 17 made by techniques well known in the art and an alloy connection 19 is made through to the N+ region to provide a collector connection.

It will be apparent to one skilled in the art that in the light of the above teaching many sets of criteria for the practice of the invention will become apparent but in order to provide a starting place for one skilled in the art, the following set of specifications are set forth.

The substrate 1 is a silicon wafer having a boron (or gallium) impurity concentration of approximately $10^{14}$ to $10^{15}$ atoms per cc. The wafer 1 is oxidized at about 1000° C. in water vapor for 6–10 hours to provide a layer of silicon dioxide 7 approximately .6 to 0.8 microns thick. Openings 8 are then made in the layer to a width of approximately 5 microns. The wafer 1 is then heated to about 1100° C. in a diffusion furnace in which an atmosphere of boron is present. For a heating period of six hours the region 9 will have boron surface concentration of approximately $10^{19}$ atoms per cc. to a depth of greater than 1 micron. The wafer is then stripped of the initial $SiO_2$ layer 7 by etching in HF. The wafer is then reoxidized. Through the use of well known photoengraving techniques a $SiO_2$ strip of about 15 to 25 microns wide is positioned on the substrate 1 covering the high conductivity type regions 9. The wafer 1 is then placed in a vapor growth atmosphere involving a hydrogen reduction of a halogen compound of silicon in which the substrate 1 is generally maintained at approximately 1200° C. as the highest temperature point in the system, and a vapor of a halogen compound of the silicon, generally silicon tetrachloride ($SiCl_4$), containing a sufficient concentration of arsenic hydride, generally arsine ($AsH_3$ a N-type dopant), is caused to decompose and to provide an epitaxial growth containing a high concentration of approximately $1 \times 10^{19}$ atoms per cc. of arsenic impurities in the grown material. The region 11 is grown for a period of 10–15 minutes to a thickness of about 4–6 microns at which time the concentration of arsenic in the vapor is reduced to a point wherein a substantial reduction of arsenic impurities in the epitaxially grown material is noted and a region 12 of semiconductor material is provided about 3–5 microns thick, depending upon the device requirements, and having a concentration of N conductivity type impurity in the vicinity of $1 \times 10^{16}$ to $5 \times 10^{17}$ atoms per cc. The substrate 1 having the P+ regions 9 and the N+ and N regions 11 and 12 thereon is then heated to about 1150° C. in an epitaxial reactor in which heat of about 1000° C. in a gas mixture of silicon tetrachloride, carbon dioxide and hydrogen is continuously flowed through. For a period of 40–50 minutes, a layer 13 of 8–10 microns of $SiO_2$ is deposited to protect the surface and to fill the channels masked by the $SiO_2$ layer 10. The $SiO_2$ layer 13 is then removed by abrading or chemical etching to expose the N semiconductor surface 12, and leaving channels filled with material 6 made up of the layers 10 and 13. The base region 15 may then be fabricated by again coating with $SiO_2$, providing an opening and diffusing boron into the N region to within 1 to 8 microns of the N+ region. The emitter 16 is similarly fabricated by a $SiO_2$ coating 17, providing an opening and subsequently diffusing phosphorous or arsenic into the region 15 to form the emitter region 16. Openings are again provided through the $SiO_2$ coating 17 to the desired regions and ohmic contacts 18 and 19 are provided by techniques well known in the art. Although $SiO_2$ has been described, other dielectric, for example, SiO, $Al_2O_3$ may be used. Also the channel material 6 may be partially $SiO_2$ and the remainder with any high temperature material, for example, polycrystalline silicon.

What has been described is a technique of isolating planar semiconductor devices with a combination of PN junction and encapsulant isolation which provides a superior structure. The superiority is gained by the fact that the structure provides the heat dissipation advantages of isolation using a PN junction which permits a high density of devices on a substrate and the reduced deleterious electrical effects of the oxide type of encapsulant isolation. The vapor deleterious electrical effect in isolation is parasitic capacitance.

With respect to device density in heat dissipation the PN junction connection to the substrate is approximately 100 times better than the heat dissipation properties of $SiO_2$.

With respect to parasitic capacitance, the total capacitance referring to FIG. 6 is the sum of the capacitance CW at the sides of the device at elements 6 and CB at the bottom of the device at surface 2. The following approximate capacitance values provide a measure of the capacitance of the isolation technique of the invention.

| | CW, picofarads/mil 2 | CB, picofarads/mil 2 |
|---|---|---|
| Junction isolation | 0.15–0.20 | 0.06–0.09 |
| Complete oxide isolation | 0.005 | 0.005 |
| Composite junction and encapsulant solution | 0.005 | 0.06–0.09 |

Thus it will be apparent that the composite isolation of the invention achieves both low parasitic capacitance advantages and the high heat dissipation advantages.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. The process of providing an isolated planar semiconductor device structure comprising the steps of providing a protective coating on a substrate of a first conductivity type semiconductor material;

opening apertures in said coating in a configuration serving to encompass for isolation a discrete portion of a major surface of said semiconductor substrate on which a semiconductor device is to be fabricated;

diffusing a first conductivity type determining impurity through said openings thereby converting portions of said first conductivity type substrate adjacent to said openings to a higher first conductivity type region;

providing a protective coating over said regions of higher conductivity type on said substrate;

epitaxially growing at least one opposite conductivity type region on said major surface of said semiconductor substrate;

providing an encapsulant coating over the epitaxially grown and protected portions of said major surface of said substrate;

and removing said protective coating down to the exposure of the surface of said epitaxially grown semiconductor material.

2. The process of providing an isolated planar silicon semiconductor device structure comprising the steps of providing a silicon dioxide coating on a substrate of a first conductivity type semiconductor material;

opening apertures in said coating in a configuration serving to encompass for isolation a discrete portion of a major surface of said semiconductor substrate on which a semiconductor device is to be fabricated;

diffusing a first conductivity type determining impurity through said opening thereby converting portions of said first conductivity type substrate adjacent to said openings to a higher first conductivity type region;

providing a protective coating over said regions of higher conductivity type on said substrate;

epitaxially growing at least one opposite conductivity type region on said major surface of said semiconductor substrate;

providing an encapsulant coating over the epitaxially grown and protected portions of said major surface of said substrate;

and removing said protective coating down to the exposure of the surface of said epitaxially grown semiconductor material.

3. The process of providing an isolated planar semiconductor device structure comprising the steps of providing a protective coating on a substrate of a first conductivity type semiconductor material;

opening apertures in said coating in a configuration serving to encompass for isolation a discrete portion of a major surface of said semiconductor substrate on which a semiconductor device is to be fabricated;

diffusing a first conductivity type determining impurity through said openings thereby converting portions of said first conductivity type substrate adjacent to said openings to a higher first conductivity type region;

providing a protective coating over said regions of higher conductivity type on said substrate;

epitaxially growing at least one opposite conductivity type region on said major surface of said semiconductor substrate;

providing an encapsulant coating over the epitaxially grown and protected portions of said major surface of said substrate;

removing said protective coating down to the exposure of the surface of said epitaxially grown semiconductor material;

providing a diffusion masking coating on said exposed epitaxial material and said encapsulating material in said channels;

diffusing a first conductivity type determining impurity through said opening forming thereby a base region in said epitaxially grown opposite conductivity type region;

providing a second diffusion mask operating to restrict diffusion to an area smaller than said base region;

diffusing an opposite conductivity type determining impurity through said mask forming thereby an emitter region within said base region;

and providing ohmic contacts through openings in said mask to each of said emitter region, said base region, and through to said original conductivity type region.

4. The process of providing an isolated planar silicon semiconductor device structure comprising the steps of providing a silicon dioxide coating on a silicon substrate of a first P conductivity type semiconductor material containing boron as a conductivity type determining impurity;

opening apertures in said silicon dioxide in a configuration serving to encompass for isolation a discrete portion of a major surface of said silicon semiconductor substrate on which a semiconductor device is to be fabricated;

diffusing phosphorous as a first conductivity type determining impurity through said openings thereby converting portions of said P type substrate adjacent to said openings to a higher P conductivity type region;

providing a silicon dioxide coating over said regions of higher P conductivity type on said P substrate;

epitaxially growing at least one N conductivity type region of silicon on said major surface of said P silicon semiconductor substrate;

providing a silicon dioxide coating over the epitaxially grown and protected portions of said major surface of said P silicon substrate;

removing said silicon dioxide coating down to the exposure of the surface of said epitaxially grown N silicon material;

providing a silicon dioxide coating on said exposed epitaxial material and said encapsulating material in said channels;

diffusing boron as a first conductivity type determining impurity through said opening forming thereby a base region in said epitaxially grown silicon N conductivity type region;

providing a second silicon dioxide diffusion mask operating to restrict diffusion to an area smaller than said base region;

diffusing phosphorous as an opposite conductivity type determining impurity through said mask forming thereby an emitter region within said base region;

and providing ohmic contacts through openings in said mask to each of said emitter region, said base region, and through to said original N conductivity type epitaxially grown region.

References Cited

UNITED STATES PATENTS

| | | | |
|---|---|---|---|
| 3,156,591 | 11/1964 | Hale et al. | 148—175 |
| 3,206,339 | 9/1965 | Thornton | 148—174 XR |
| 3,234,058 | 2/1966 | Marinace | 148—175 |
| 3,260,902 | 7/1966 | Porter | 148—175 XR |
| 3,265,542 | 8/1966 | Hirshon | 148—175 |
| 3,296,040 | 1/1967 | Wigton | 148—175 |
| 3,343,255 | 9/1967 | Donovan | 148—1.5 XR |
| 3,354,360 | 11/1967 | Campagna et al. | 29—578 XR |

HYLAND BIZOT, *Primary Examiner.*

P. WEINSTEIN, *Assistant Examiner.*